United States Patent
Lee et al.

(10) Patent No.: US 9,820,340 B2
(45) Date of Patent: Nov. 14, 2017

(54) ORGANIC LIGHT EMITTING DIODE DISPLAY DEVICE AND FABRICATION METHOD THEREOF

(71) Applicant: LG Display Co., Ltd., Seoul (KR)

(72) Inventors: Kyu Hwang Lee, Seoul (KR); Tae Joon Song, Gyeonggi-do (KR); Jung Eun Lee, Seoul (KR); Kyung Ha Lee, Gyeonggi-do (KR); Hwan Keon Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 11 days.

(21) Appl. No.: 14/816,523

(22) Filed: Aug. 3, 2015

(65) Prior Publication Data

US 2016/0165677 A1      Jun. 9, 2016

(30) Foreign Application Priority Data

Dec. 9, 2014 (KR) ..................... 10-2014-0175590

(51) Int. Cl.
| | |
|---|---|
| *H01J 9/00* | (2006.01) |
| *H01J 9/26* | (2006.01) |
| *H05B 33/04* | (2006.01) |
| *H05B 33/10* | (2006.01) |
| *H05B 33/14* | (2006.01) |

(52) U.S. Cl.
CPC ............. *H05B 33/04* (2013.01); *H05B 33/10* (2013.01); *H05B 33/14* (2013.01)

(58) Field of Classification Search
None
See application file for complete search history.

(56) References Cited

U.S. PATENT DOCUMENTS

| | | | |
|---|---|---|---|
| 8,093,656 B2 * | 1/2012 | Kawase | ............... G02B 5/201 257/350 |
| 2011/0199348 A1 * | 8/2011 | Takatani | ............ G02F 1/13452 345/204 |

* cited by examiner

*Primary Examiner* — Ashok Patel
(74) *Attorney, Agent, or Firm* — Morgan, Lewis & Bockius LLP

(57) ABSTRACT

An organic light emitting display device includes a substrate having a display area and a non-display area, an organic light emitting element and a sealing layer sequentially stacked on one side of the substrate in the display area, a support layer on the one side of the substrate in the non-display area, and a polarizing plate on the support layer in the non-display area and on the sealing layer in the display area, the polarizing plate covering an entirety of the support layer.

8 Claims, 3 Drawing Sheets

ORGANIC LIGHT EMITTING DIODE DISPLAY DEVICE AND FABRICATION METHOD THEREOF

The present application claims the benefit of priority under 35 U.S.C. §119(a) to Korean Patent Application No. 10-2014-0175590, filed on Dec. 9, 2014, which is hereby incorporated by reference in its entirety.

BACKGROUND

Field of the Disclosure

The present application relates to an organic light emitting diode display device and a fabrication method thereof that may be adapted to prevent damage of a non-display area in an inorganic insulation substrate used as a base substrate.

Description of the Related Art

Nowadays, plastic display devices, which include a plastic substrate, are being developed. The plastic substrate used in the plastic display device is generally formed from polyimide, has a light weight, and endures impacts well. The polyimide may have superior properties, such as high moisture permeability, high flexibility, and so on.

Such plastic display devices generally include components disposed on a polyimide substrate. The components disposed on the polyimide substrate may include organic light emitting elements, touch sensing elements, thin film transistors, and so on. In order to form the components, a thin film process may need to be repeatedly performed for the polyimide substrate.

However, the thin film transistors formed on the polyimide substrate using an organic material may have unstable properties. For example, a transparent polyimide substrate used in the transparent plastic display device may need to limit the temperature of the formation procedure of the thin film transistor because of its heat resistant property below 250° C. Due to this, it may be difficult to secure stable properties of the components such as the thin film transistor, the organic light emitting element, and so on.

To address this matter, a method of using an inorganic insulation substrate as a substrate of the plastic display device has been proposed. When the inorganic insulation substrate is used in the plastic display device, the thin film transistors formed on the inorganic insulation substrate may provide superior properties. However, the inorganic insulation substrate may be easily cracked or broken because of its low flexibility.

SUMMARY

Accordingly, embodiments of the present application are directed to an organic light emitting diode display device and a fabrication method thereof that substantially obviate one or more of problems due to the limitations and disadvantages of the related art.

The embodiments provide an organic light emitting diode display device and a fabrication method thereof which are adapted to prevent damage of an inorganic insulation substrate by disposing a support layer on a non-display area.

Also, the embodiments provide an organic light emitting diode display device and a fabrication method thereof which are adapted to simplify the fabrication procedure and prevent damage of an inorganic insulation substrate by disposing a support layer of an opaque organic insulation material on a non-display area without forming an opaque insulation material layer, which is used to shield the non-display area from a user, on the rear surface of a cover substrate.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In order to solve the above-mentioned problems, an organic light emitting display device according to an example embodiment includes a substrate having a display area and a non-display area, an organic light emitting element and a sealing layer sequentially stacked on one side of the substrate in the display area, a support layer on the one side of the substrate in the non-display area, and a polarizing plate on the support layer in the non-display area and on the sealing layer in the display area, wherein the polarizing plate covers an entirety of the support layer.

According to an example embodiment, a method of manufacturing an organic light emitting display device includes preparing a substrate, the substrate including a display area and a non-display area, providing an organic light emitting element in the display area of the substrate, providing a sealing layer on the organic light emitting element in the display area of the substrate, providing a liquefied organic insulation material in the non-display area of the substrate, and providing a polarizing plate on the sealing layer and the liquefied organic insulation material.

Other systems, methods, features, and advantages, will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
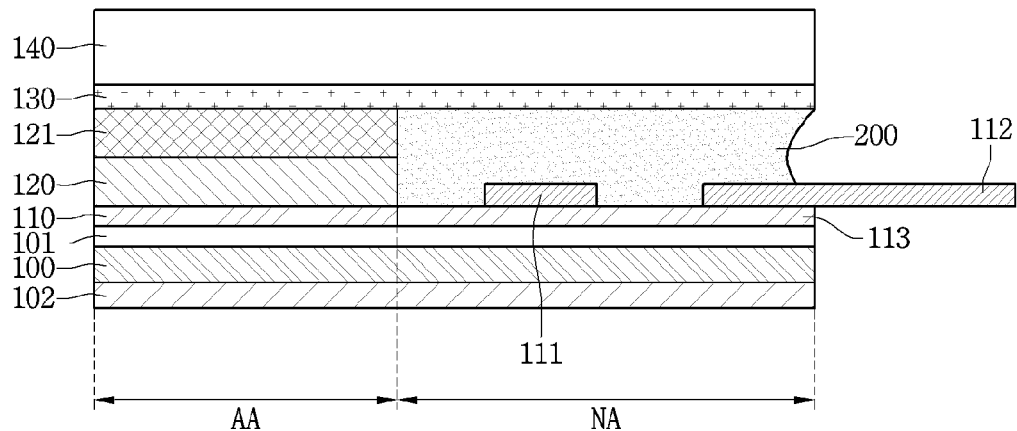
FIG. 1 is a cross-sectional view showing an organic light emitting diode display device according to an embodiment of the present disclosure.

Reference will now be made in detail to embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different way, and are not limited to these embodiments described here. In the drawings, the size, thickness, and so on of a device can be exaggerated for convenience of explanation. Where possible, the same or like reference numbers may be used throughout this disclosure, including the drawings, to refer to the same or like parts.

FIG. 1 is a cross-sectional view showing an organic light emitting diode display device according to an embodiment of the present disclosure. With reference to FIG. 1, an organic light emitting diode display device according to an embodiment of the present disclosure includes an inorganic insulation substrate 100 defined into a display area AA and a non-display area NA. The organic light emitting diode display device includes a protective film 102 disposed on the rear surface of the inorganic insulation substrate 100 and configured to protect the inorganic insulation substrate 100. The inorganic insulation substrate 100 may be formed, e.g., from one of a silicon oxide ($SiO_2$) and a silicon nitride ($SiN_x$.) As such, properties of elements or components within the organic light emitting diode display device may be enhanced. Moreover, the organic light emitting diode display device may include a buffer layer 101 disposed on the inorganic insulation substrate 100.

A thin film transistor 110, an organic light emitting element 120, and a sealing layer 121 may be sequentially disposed in the display area AA of the inorganic insulation substrate 100. A pad electrode 113, an integrated circuit chip 111, and a flexible printed circuit board 112 may be disposed in the non-display area NA of the inorganic insulation substrate 100.

The inorganic insulation substrate 100 used in the organic light emitting diode display device may have low flexibility. Because of this, the inorganic insulation substrate 100 may be damaged.

For example, in order to fabricate the organic light emitting diode display device, the inorganic insulation substrate defined into a display area and a non-display area may be disposed on a carrier substrate coated with a sacrifice layer. The thin film transistor, the organic light emitting element, the pad electrode, the integrated circuit chip, and the flexible printed circuit board may be formed or disposed on the inorganic insulation substrate. Moreover, a polarizing plate may be attached on the display area of the inorganic insulation substrate provided with the thin film transistor, the organic light emitting element, the pad electrode, the integrated circuit chip, and the flexible printed circuit board.

Thereafter, the organic light-emitting diode display device may be turned over by an angle of 180°. The carrier substrate and the sacrifice layer may be removed from the organic light emitting diode display device through, for example, a laser process. In this manner, one surface of the inorganic insulation substrate is externally exposed. The exposed inorganic insulation substrate may be protected by a protective film which is attached (or formed) on the inorganic insulation substrate through a roll laminating process. In order to form the protective film on the inorganic insulation substrate, the organic light emitting diode display device may be fastened by performing a vacuum suction process for the polarizing plate opposite to the inorganic insulation substrate. Subsequently, the protective film may be attached on the exposed inorganic insulation substrate by performing the roll lamination process while applying a fixed pressure to the exposed inorganic insulation substrate.

However, the inorganic insulation substrate may not be uniformly supported during the roll laminating process because the polarizing plate may not be disposed in the non-display area of the inorganic insulation substrate. For example, a height difference may be generated between the display area and the non-display area, because the thin film transistor, the organic light emitting element, and so on, may not be disposed in the non-display area of the inorganic insulation substrate. Due to this, the pressure applied to the non-display area of the inorganic insulation substrate may damage the inorganic insulation substrate.

In order to compensate for the height difference between the display area and the non-display area, a silicon material may be coated on the non-display area of the inorganic insulation substrate. However, it may be difficult for the silicon material formed in the non-display area to have the same height surface as the polarizing plate disposed in the display area. Due to this, a height difference between the display area and the non-display area may remain, and the inorganic insulation substrate may be cracked or broken in the roll laminating process that is applied to the formation of the protective film.

To address this matter, the organic light emitting diode display device of embodiments of the present disclosure provides for a support layer 200 to be disposed in the non-display area NA of the inorganic insulation substrate 100. For example, the support layer 200 may be disposed on the non-display area NA of the inorganic insulation substrate 100 which is provided with the pad electrode 113, the integrated circuit chip 111, and the flexible printed circuit board 112.

As the support layer 200 may be disposed throughout the non-display area NA of the inorganic insulation substrate 100, the non-display area NA of the inorganic insulation substrate 100 may be supported during the roll laminating process. In other words, the entire surface of the inorganic insulation substrate 100—including the display area AA and the non-display area NA—may be uniformly supported during the roll laminating process.

The support layer 200 may be formed from an opaque organic insulation material. For example, the support layer 200 may be formed from the same material as a black matrix which is disposed on one surface of a color filter array substrate (not shown) facing the inorganic insulation substrate 100.

Alternatively, the support layer 200 may be formed from a liquefied organic insulation material. As such, the support layer 200 may be uniformly formed throughout the non-display area NA of the inorganic insulation substrate 100. Therefore, the support layer 200 may allow a part of the inorganic insulation substrate 100 corresponding to the non-display area NA to be supported during the roll laminating process.

The upper surface of the support layer 200 disposed in the non-display area NA may have the same height as the upper surface of the sealing layer 121 disposed in the display area AA. In accordance therewith, the height difference between the display area AA and the non-display area NA may be compensated for (or removed) by means of the support layer disposed in the non-display area NA.

A polarizing plate 130 may be disposed on the support layer 200, which is disposed in the non-display area NA, and on the sealing layer 121, which is disposed in the display area AA. In this case, the polarizing plate 130 may be disposed to have a flattened upper surface, because the upper surface of the support layer 200 may have the same height as that of the sealing layer 121.

A cover substrate 140 may be disposed on the polarizing plate. As the polarizing plate 130 has the flattened upper surface, the cover substrate 140 may also be disposed to have a flattened upper surface.

The cover substrate 140 may cover the entire upper surface of the organic light emitting diode display device. For example, the cover substrate 140 may cover one surface disposed in an image display direction of the organic light emitting diode display device. Such a cover substrate 140 may be formed from a transparent material, such as glass, plastic, etc. Alternatively, the cover substrate 140 may be a touch screen panel.

If the cover substrate 140 is a touch screen panel, a part of the cover substrate 140 corresponding to the non-display area NA of the organic light emitting diode display device may need to be opaquely treated. To this end, an opaque insulation material may be disposed on a part of the rear surface of the cover substrate 140 disposed in (or overlapped with) the non-display area NA of the organic light emitting diode display device. In other words, it may be necessary to further perform a process of forming the opaque insulation material layer on a part of the rear surface of the cover substrate 140 which is disposed in (or overlapped with) the non-display area NA of the organic light emitting diode display device.

However, the organic light emitting diode display device of the present disclosure may provide for the support layer 200 formed from an opaque insulation material and the polarizing plate 130 to be sequentially disposed throughout the non-display area NA. As such, the non-display area NA is not viewable to a user. In accordance therewith, although a touch screen panel may be used as the cover substrate 140, the organic light emitting diode display device of embodiments of the present disclosure may omit a process of forming this opaque insulation material layer on a part of the rear surface of the cover substrate 140, thereby further simplifying the fabrication procedure.

Thus, the organic light emitting diode display device of embodiments of the present disclosure may provide for the support layer 200 with an upper surface having the same height as that of the sealing layer 121 to be disposed in the non-display area NA. Thus, damage of the inorganic insulation substrate 100 during a process of disposing the protective film 102 on one surface of the inorganic insulation substrate 100 may be prevented.

Furthermore, the support layer 200 formed from an opaque organic insulation material may be disposed in the non-display area NA of the organic light emitting diode display device. In accordance therewith, although a touch screen panel may be used as the cover substrate 140, a process of forming an opaque insulation material layer (which enables the non-display area NA to be not viewed by a user) on a part of the rear surface of the cover substrate 140 can be omitted.

Figure 2A:
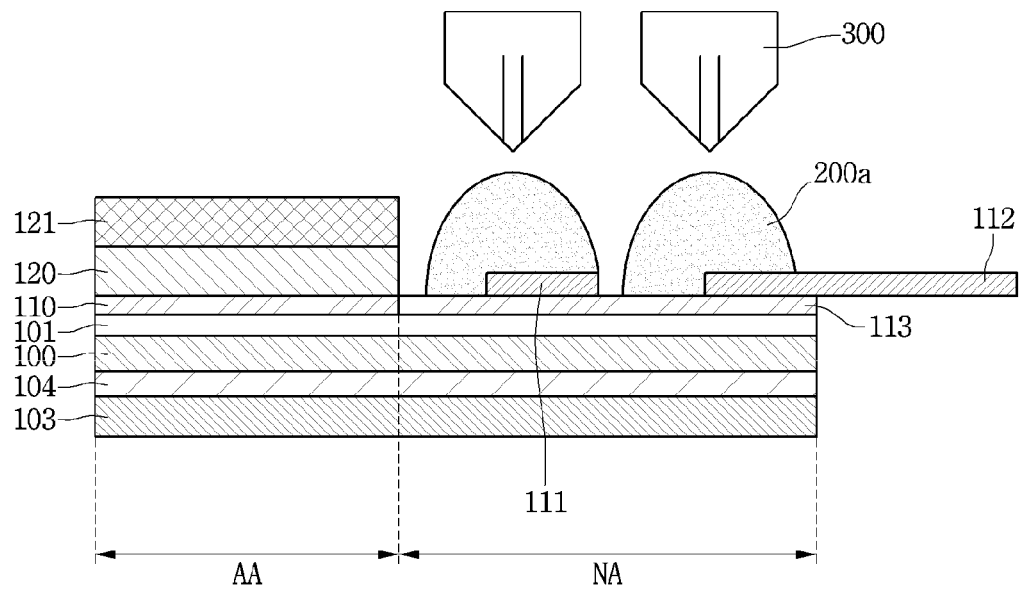
FIGS. 2A through 2D are cross-sectional views illustrating a method of an organic light emitting diode display device according to an embodiment of the present disclosure.

A method of fabricating an organic light emitting diode display device according to an embodiment of the present disclosure will be described with reference to FIGS. 2A through 2D. FIGS. 2A through 2D are cross-sectional views illustrating a method of forming an organic light emitting diode display device according to an embodiment of the present disclosure. With reference to FIG. 2A, the fabrication method of the organic light emitting diode display device according to an embodiment of the present disclosure includes forming a sacrifice layer 104 on a carrier substrate 103. An inorganic insulation substrate 100 may be disposed on the carrier substrate 103 provided with the sacrifice layer 104. The inorganic insulation substrate 100 may be formed, e.g., from one of a silicon oxide ($SiO_2$) and a silicon nitride ($SiN_x$). Such an inorganic insulation substrate 100 may be defined into a display area AA and a non-display area NA.

A buffer layer 101 may be formed on the entire surface of the inorganic insulation substrate 100, including the display area AA and the non-display area NA. Afterwards, a thin film transistor 110 may be formed in the display area AA of the inorganic insulation substrate 100. Although not shown in the drawing, the thin film transistor 110 includes a semiconductor layer, a gate insulation film, a gate electrode, a source electrode, and a drain electrode. At the same time, a pad electrode 113 may be formed in the non-display area NA of the inorganic insulation substrate 100.

Thereafter, an organic light emitting element 120 connected to the thin film transistor 110 disposed in the display area AA of the inorganic insulation substrate 100 may be formed. Although not shown in the drawing, the organic light emitting element 120 includes a first electrode, an organic emission layer, and a second electrode. The first electrode of the organic light emitting element 120 may be electrically connected to the drain electrode of the thin film transistor 110. Also, a sealing layer 121 used to seal the organic light emitting element 120 may be formed on the organic light emitting element 120. The sealing layer 121 may protect the organic light emitting element 120 from the intrusion of moisture and/or oxygen.

Subsequently, an integrated circuit chip 111 and a flexible printed circuit board 112 are disposed on the non-display area NA of the inorganic insulation substrate 100 provided with the pad electrode 113. The pad electrode 113 may be electrically connected to the flexible printed circuit board 112, but it is not limited in this regard. For example, the pad electrode 113 can be electrically connected to the integrated circuit chip 111.

The integrated circuit chip 111 may be mounted on the pad electrode 113 in a chip on glass (COG) mode. The flexible printed circuit board 112 may be mounted on the inorganic insulation substrate 100 in a chip on film (FOG) mode. Although not shown in the drawing, a protective layer used to protect the integrated circuit chip 111 and the flexible printed circuit board 112 may be formed around the integrated circuit chip 111 and the flexible printed circuit board 112.

In such a structure on the inorganic insulation substrate 100, a height difference between the display area AA and the non-display area NA may be generated. This results from the height of the upper surface of the sealing layer 121 being higher than those of the upper surfaces of the integrated circuit chip 111 and the flexible printed circuit board 112.

To remove the height difference between the display area AA and the non-display area NA, a support layer 200 may be formed on the non-display area NA of the inorganic insulation substrate 100 loaded with the integrated circuit chip 111 and the flexible printed circuit board 112. To this end, a liquefied organic insulation material 200a may be disposed on the non-display area NA of the inorganic insulation substrate 100. The liquefied organic insulation material 200a may be coated on the non-display area NA of the inorganic insulation substrate 100 by being discharged through nozzles 300, as shown in FIG. 2A.

At this time, the liquefied organic insulation material 200a may be partially coated on the non-display area NA of the inorganic insulation substrate 100. However, the liquefied organic insulation material 200a may have (or maintain) low viscosity at a high temperature before being coated on the inorganic insulation substrate 100. Thus, the liquefied organic insulation material 200a may be widely spread even though it may be partially coated on the non-display area NA of the inorganic insulation substrate 100.

The liquefied organic insulation material 200a may be an opaque organic insulation material. For example, the liquefied organic insulation material 200a may be the same material as that of a black matrix disposed on one surface of a color filter array substrate facing the inorganic insulation substrate 100.

Subsequently, a polarizing plate 130 may be disposed on the inorganic insulation substrate 100 provided with the sealing layer 121, which may be disposed in the display area AA, and the liquefied organic insulation material 200a, which may be disposed in the non-display area NA. In other words, the polarizing plate 130 can be disposed on the entire surface of the inorganic insulation substrate 100.

Figure 2B:
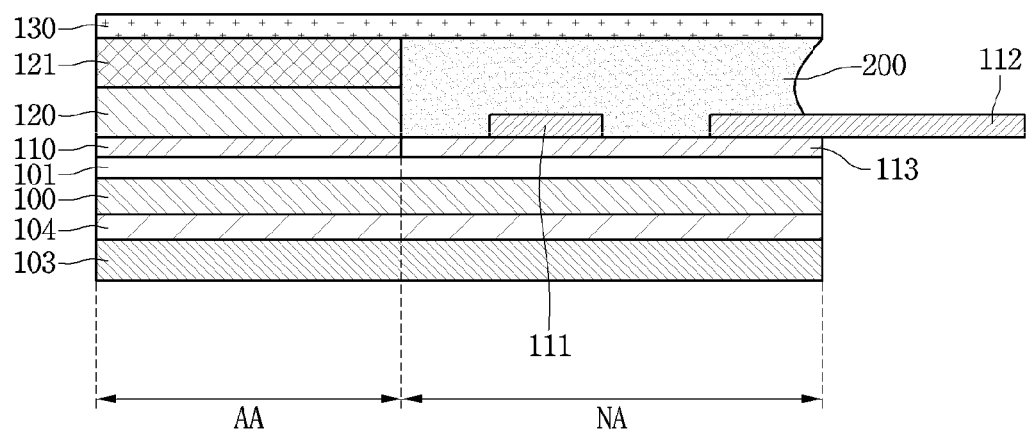

At the same time, as shown in FIG. 2B, the liquefied organic insulation material 200a partially coated on the non-display area NA of the inorganic insulation substrate 100 may be attached to and depressed by the polarizing plate 130. As such, the liquefied organic insulation material 200a may be spread throughout the non-display area NA of the inorganic insulation substrate 100. In accordance therewith, the support layer 200 may be formed throughout the non-display area NA of the inorganic insulation substrate 100. The support layer 200 may maintain high viscosity at room temperature and prevent an overspreading phenomenon of the liquefied organic insulation material 200a. Also, because it may be unnecessary to perform a hardening process for the liquefied organic insulation material 200a, the fabrication procedure of the organic light emitting diode display device may be simplified.

The upper surface of the support layer 200 may have the same height as that of the sealing layer 121 disposed in the display area AA of the inorganic insulation substrate 100. In other words, the height difference between the display area AA and the non-display area NA may be compensated for or removed by the support layer 200. As such, the polarizing plate 130 may be evenly disposed on the sealing layer 121 and the support layer 200.

Figure 2C:
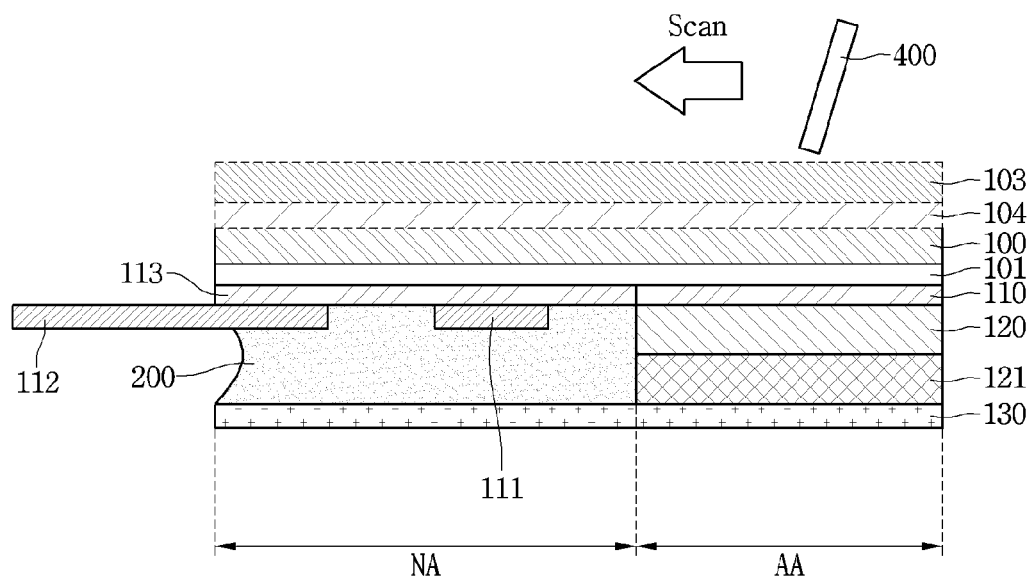

Thereafter, the organic light emitting diode display device provided with the polarizing plate 130 may be rotated by an angle of 180°, as shown in FIG. 2C. For example, the organic light emitting diode display device may be turned over so that the upper surface of the carrier substrate 103 may be upwardly exposed. Then, the organic light emitting diode display device may be fastened by vacuum-aspirating the polarizing plate 130. At this time, the polarizing plate 130 may be easily vacuum-aspirated because it is evenly disposed.

Also, as the polarizing plate 130 may be disposed on non-display area NA and may be supported by the support layer 200, the entire surface of the organic light emitting diode display device may be evenly fastened (or supported) by the vacuum aspiration (or suction) power.

Afterward, the carrier substrate 103 and the sacrifice layer 104 are removed from the organic light emitting diode display device using, for example, a laser 400. As the carrier substrate 103 and the sacrifice layer 104 are removed, one surface (e.g., an outer surface) of the inorganic insulation substrate 100 may be externally exposed.

Figure 2D:
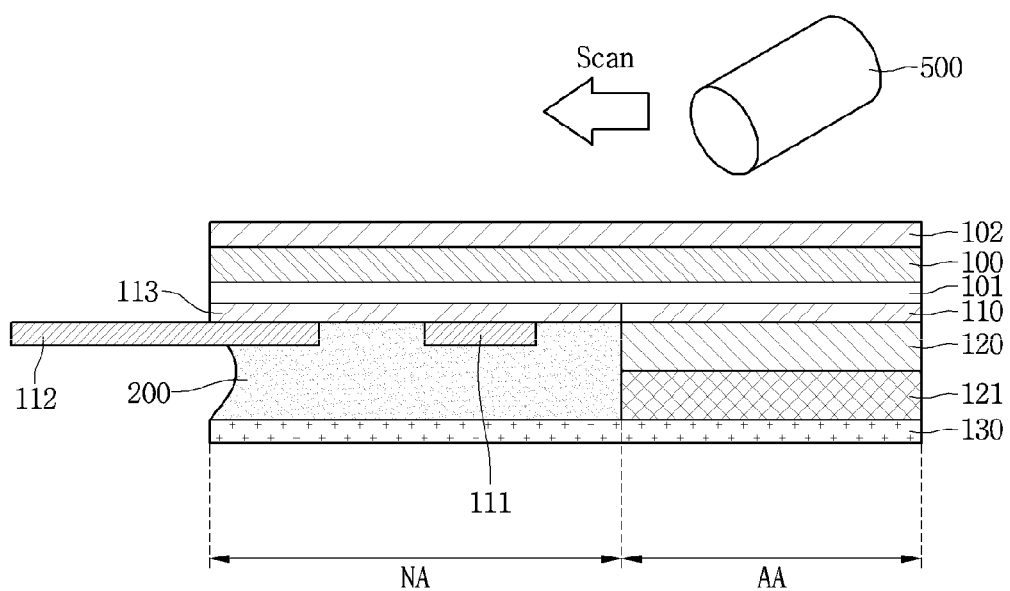

Subsequently, as shown in FIG. 2D, a protective film 102 may be attached on the exposed surface of the inorganic insulation substrate 100 using, for example, a roll laminating method. In an example of the roll laminating method, a roller 500 is brought into contact with one edge of the exposed surface of the inorganic insulation substrate 100, and the roller is enabled to scan the exposed surface of the inorganic insulation substrate 100 along a direction applying a fixed pressure to the inorganic insulation substrate 100. In accordance therewith, the protective film 102 may be attached on the exposed surface of the inorganic insulation substrate 100.

In this way, the protective film 102 may be attached from one edge to the other edge of the exposed surface of the inorganic insulation substrate 100. In this example, the inorganic insulation substrate 100 may not be damaged by the pressure applied by the attachment of the protective film 102, because the height difference between the display area AA and the non-display area NA is compensated for (or removed) by the support layer 200.

Although not shown in the drawings, a cover substrate may be disposed on the upper surface of the polarizing plate 130. The cover substrate may be formed from a transparent material such as glass, plastic, or other materials. Alternatively, the cover substrate may be a touch screen panel.

In this manner, the organic light emitting diode display device according to embodiments of the present disclosure provides for the support layer 200 with the upper surface having the same height as that of the sealing layer 121 to be disposed in the non-display area NA. Thus, during the process of removing the sacrifice layer 104 and the carrier substrate 103 from one surface of the inorganic insulation substrate 100 and the process of attaching the protective film 102 on one surface of the inorganic insulation substrate 100, the damage phenomenon of the inorganic insulation substrate 100 may be prevented.

The above-mentioned features, structures, effects, and so on of the present disclosure are included in at least one embodiment without being limited to only such an embodiment. Moreover, it should be apparent to the ordinary skilled person in the art that various variations and modifications are possible to the features, structures, effects, and so on which are disclosed by the embodiments. Therefore, it is interpreted that such variations and modifications are included in the scope of the present disclosure.

Although the present disclosure has been explained with regard to the embodiments described above, it should be understood by the ordinary skilled person in the art that the present disclosure is not limited to these embodiments, but rather that various changes or modifications thereof are possible without departing from the spirit of the present disclosure. For example, various variations and modifications are possible in the component parts which are described in the embodiments It will be apparent to those skilled in the art that various modifications and variations can be made in the display device of the present invention without departing from the spirit or scope of the invention. Thus, it is intended that the present invention cover the modifications and variations of this invention provided they come within the scope of the appended claims and their equivalents.

What is claimed is:

1. A method of manufacturing an organic light emitting display device, the method comprising:
   preparing a first substrate, the first substrate including a display area and a non-display area;
   providing an organic light emitting element in the display area of the first substrate;
   providing a sealing layer on the organic light emitting element in the display area of the first substrate;
   providing a liquefied organic insulation material in the non-display area of the first substrate; and
   providing a polarizing plate on the sealing layer and the liquefied organic insulation material.

2. The method of claim 1, wherein the polarizing plate is on an entire surface of the first substrate.

3. The method of claim 1, further comprising:
the liquefied organic insulation material attached to and depressed by the polarizing plate, the liquefied organic insulation material spreading throughout the non-display area of the first substrate and forming a support layer.

4. The method of claim 3, wherein an upper surface of the support layer and an upper surface of the sealing layer have a same height relative to the first substrate.

5. The method of claim 4, further comprising:
providing a sacrifice layer on a carrier substrate; and
providing the first substrate on the carrier substrate prior to providing the organic light emitting element on the first substrate.

6. The method of claim 5, further comprising:
removing the carrier substrate and the sacrifice layer from the display device; and
attaching a protective film on the outer surface of the first substrate using roll lamination.

7. The method of claim 1, further comprising:
combining the first substrate, which is provided with the support layer, with a color filter array substrate opposed to the first substrate and provided with a black matrix.

8. The method of claim 7, wherein the material of the support layer comprises a same material as the black matrix.

* * * * *